United States Patent
Kim et al.

(10) Patent No.: US 6,803,822 B2
(45) Date of Patent: Oct. 12, 2004

(54) POWER AMPLIFIER HAVING A BIAS CURRENT CONTROL CIRCUIT

(75) Inventors: Ji Hoon Kim, Daegu (KR); Youn Sub Noh, Daejeon (KR); Chul Soon Park, Daejeon (KR); Joon Hyung Kim, Jeonju-si (KR)

(73) Assignee: Information and Communications University Educational Foundation (KR)

( * ) Notice: Subject to any disclaimer, the term of this patent is extended or adjusted under 35 U.S.C. 154(b) by 0 days.

(21) Appl. No.: 10/389,053

(22) Filed: Mar. 14, 2003

(65) Prior Publication Data

US 2004/0000954 A1 Jan. 1, 2004

(30) Foreign Application Priority Data

Jun. 29, 2002 (KR) .......................................... 2002-37533

(51) Int. Cl.[7] .................................................. H03F 3/04
(52) U.S. Cl. ......................................... 330/296; 330/285
(58) Field of Search ................................ 330/296, 285, 330/288, 289; 323/315, 316

(56) References Cited

U.S. PATENT DOCUMENTS 6,369,656 B2 * 4/2002 Dening et al. .............. 330/296
6,515,546 B2 * 2/2003 Liwinski ..................... 330/296
6,690,237 B2 * 2/2004 Miyazawa ................... 330/285

OTHER PUBLICATIONS

Tetsuo Sato, Shigehiro Yuyama, Akishige Nakajima, Hideyuki Ono, Akiyoshi Iwai, Eiichi Hase and Chusiro Kusano, "Intelligent RF Power Module Using Automatic Bias Control (ABC) System for PCS CDMA Applications", 1998 IEEE of MTT–S Digest, pp. 201–204.
Kyounghoon Yang, George I. Haddad and Jack R. East, "High–Efficiency Class–A Power Amplifiers with a Dual–Bias–Control Scheme", IEEE Transactions on Microwave Theory and Techniques, vol. 47, No. 8, Aug. 1999, pp. 1426–1432.
M. Ranjan, K. H. Koo, G. Hanington, C. Fallesen and P. Asbeck, "Microwave Power Amplifiers with Digitally–Controlled Power Supply Voltage for High Efficiency and High Linearity", 2000 IEEE MTT–S Digest, pp. 493–496.

* cited by examiner

Primary Examiner—Henry Choe
(74) Attorney, Agent, or Firm—Anderson Kill & Olick, PC

(57) ABSTRACT

A power amplifier for use in a mobile handset includes an amplifying transistor for generating an output of the mobile handset, a bias circuit having a bias transistor and providing a bias current to bias the amplifying transistor, and a bias current control circuit, responsive to a control signal, for adjusting the bias current to control an operation current of the amplifying transistor. The control signal is generated by the mobile handset, and the control signal is determined by a power level of the output of the mobile handset.

8 Claims, 6 Drawing Sheets

POWER AMPLIFIER HAVING A BIAS CURRENT CONTROL CIRCUIT

FIELD OF THE INVENTION

The present invention relates to a power amplifier; and, more particularly, to a power amplifier including a bias current control circuit capable of effectively reducing a quiescent current of the amplifier to improve the power added efficiency (PAE) thereof.

BACKGROUND OF THE INVENTION

As is well known, a power amplifier is one of major power consuming components of a cell phone. FIGS. 1A and 1B illustrate a typical prior art power amplifier module for use in a conventional CDMA cell phone.

The power amplifier shown in FIG. 1A includes a bias circuit 101 in addition to an amplifying circuit. The amplifying circuit includes an amplifying transistor Q1 having an emitter grounded; an inductor L, one end thereof being supplied with Vcc and the other end thereof being connected to a collector of Q1; an output capacitor Co disposed between the collector of Q1 and an RF_OUT terminal; and an input capacitor Ci coupled between an RF_IN terminal and a base of Q1.

The bias circuit 101 is of a current mirror structure including a bias transistor Q2, a collector thereof being supplied with Vref; a bias transistor Q3, an emitter thereof being grounded; a resistor R1, one end thereof being supplied with Vref and the other end thereof being connected to a base of Q2 and a collector of Q3; a resistor R2, one end thereof being connected to the base of Q3 and the other end thereof being coupled to an emitter of Q2; and a resistor R3, one end thereof being coupled to a node between Ci and the base of Q1 and the other end thereof being coupled to the emitter of Q2.

The power amplifier shown in FIG. 1B includes a bias circuit 102 in addition to an amplifying circuit identical to that shown in FIG. 1A. The bias circuit 102 is also of a current mirror structure including a bias transistor Qbias, a collector thereof being supplied with Vref; an emitter-base diode (i.e., a bipolar transistor with short-circuited collector and base) D1, an anode thereof being connected to a base of Qbias; an additional emitter-base diode D2, an anode thereof being connected to a cathode of D1 and a cathode thereof being grounded; and a resistor Rbias, one end thereof being supplied with Vref and the other end thereof being connected to the anode of D1.

Referring to FIGS. 1A and 1B, once Vref is set to have a certain value, $I_B$ (a bias current of Q1, i.e., a DC component of a base current of Q1) is fixed regardless of an output power. That is to say, the bias circuit 101 or 102 supplies a constant bias current regardless of the output power, which in turn gives rise to a constant quiescent current $I_c$ (i.e., a DC component of a collector current of Q1), $I_C$ being an operation current of Q1.

A maximum output power is one of most important performance figures for such power amplifiers. However, such power amplifiers are rarely in operation at the maximum output power of, e.g., 28 dBm, but mostly operate at low output power levels less than, e.g., 16 dBm. Therefore, it is required to control operation currents to be reduced at the low output power levels so that we can improve the PAE (power added efficiency) of CDMA power amplifiers.

Various research efforts have been made for a PAE improvement by controlling a bias with an aid of an additional circuitry. For example, an ABC (an automatic bias control) system was proposed to decrease the bias current by way of adjusting Vref at the low output power levels (see, e.g., T. Sato et al., "Intelligent RF power module using automatic bias control (ABC) system for PCS CDMA applications", IEEE MTT-S Int. Microwave Simp. Dig., 1998, pp.201–204). Since, however, the ABC system requires a separate ABC-chip in addition to an MMIC (monolithic microwave integrated circuit) incorporating therein a power amplifier circuitry, the size of the power amplifier module increases.

For other examples, a dynamic supply voltage ($V_{CC}$) and current adjustment based on envelope detection were proposed, where additional components such as a dc-dc converter, an envelope detector and a coupler are required (see, e.g., M. Ranjan et al., "Microwave power amplifiers with digitally-controlled power supply voltage for high efficiency and high linearity", IEEE MTT-S Int. Microwave Simp. Dig., 2000, pp.493–496; and Yang Kyounghoon et al., "High efficiency class-A power amplifiers with a dual-bias-control scheme", IEEE Trans. Microwave Theory Tech., vol.47, pp.1426–1432, August 1999). In these schemes, however, it is difficult to integrate the additional components (i.e., a dc-dc converter, an envelope detector and a coupler) in an MMIC together with power amplifiers because of the size or complexity of those components.

As described above, prior art schemes for controlling the bias of a CDMA power amplifier have drawbacks due to additional elements that substantially increase a chip area, and power consumption.

SUMMARY OF THE INVENTION

It is, therefore, an object of the present invention to provide a power amplifier module including a bias current control circuit that scarcely increases a chip area and power consumption.

In accordance with the present invention, there is provided a power amplifier for use in a mobile handset including: an amplifying transistor for generating an output of the mobile handset; a bias circuit having a bias transistor, the bias circuit providing a bias current to bias the amplifying transistor; and a bias current control circuit, responsive to a control signal, for adjusting the bias current to control an operation current of the amplifying transistor, wherein the control signal is determined by a power level of the output of the mobile handset.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
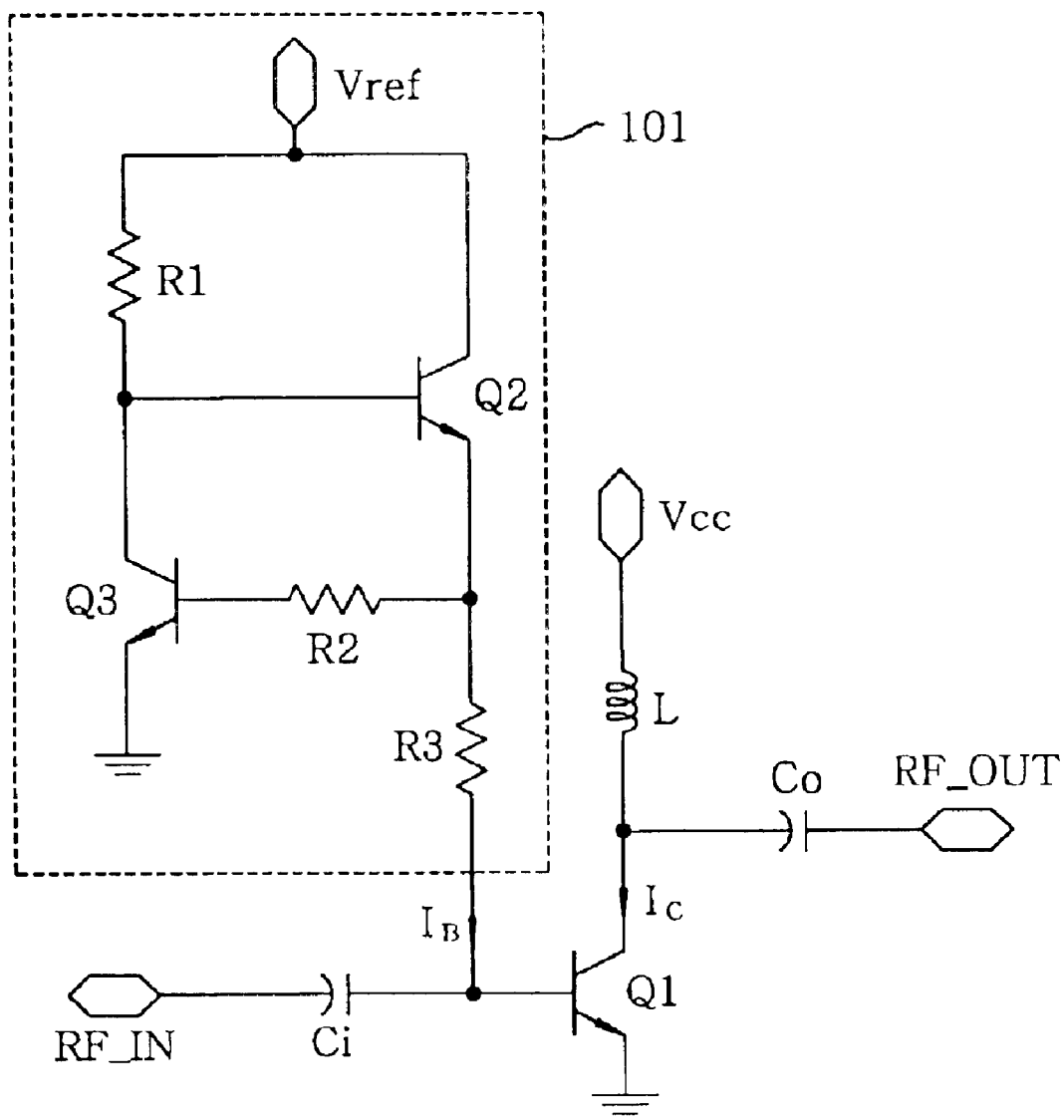
FIG. 1A presents a conventional power amplifier including a bias circuit 101 applying a bias current 1B to an amplifying transistor Q1.
Figure 2A:
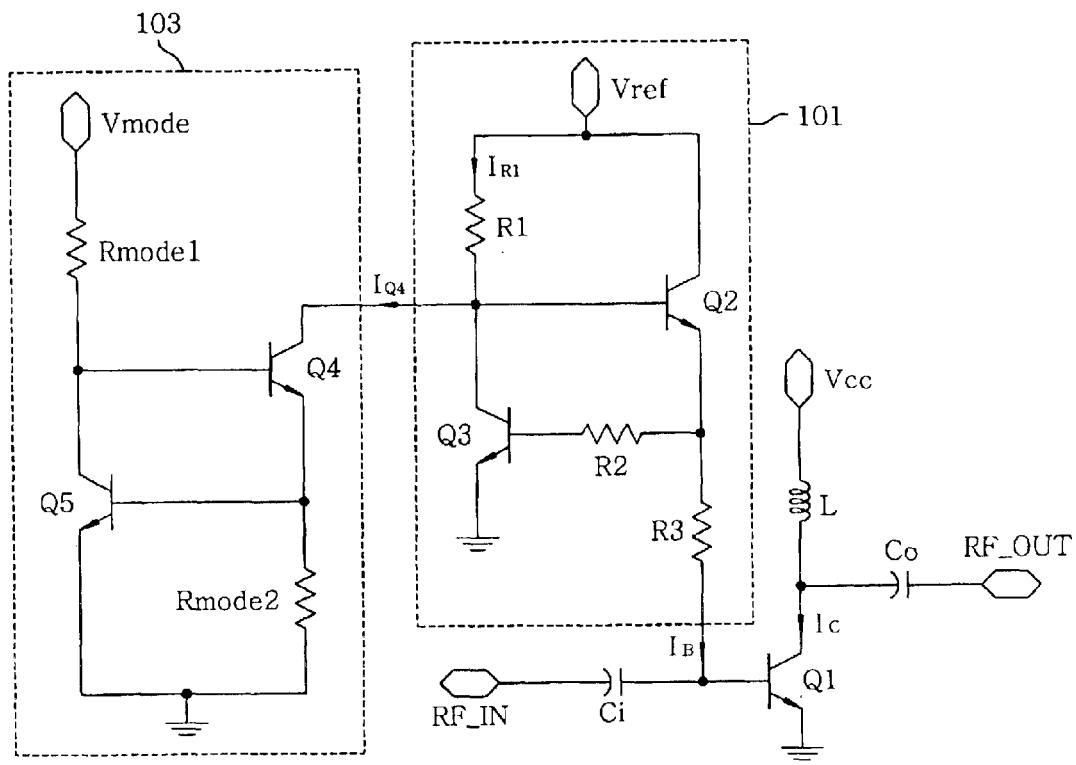
FIGS. 2A and 2B depict power amplifiers including a bias current control circuit 103 in accordance with a first embodiment of the present invention.

Referring to FIG. 2A, there is illustrated a power amplifier of the present invention, wherein the conventional power amplifier shown in FIG. 1A is provided with a bias current control circuit 103 in accordance with a first embodiment of the present invention.

The bias current control circuit 103 is of a current mirror structure including a control transistor Q4, a collector thereof being coupled to a node between R1 and Q3 of the bias circuit 101; an auxiliary transistor Q5, an emitter thereof being grounded; a resistor Rmode1, one end thereof being supplied with a control voltage Vmode and the other end thereof being coupled to a base of Q4 and a collector of Q5; and another resistor Rmode2, one end thereof being connected to an emitter of Q4 and a base of Q5 and the other end thereof being grounded. The collector of Q4 connected to a node between R1 and a collector of Q3 serves as an additional current path for the bias circuit 101. For a given bias circuit 101, $I_{Q4}$, a bypass current from the bias circuit 101 to the bias current control circuit 103, is determined by Vmode, Rmode1 and Rmode2.

Figure 3A:
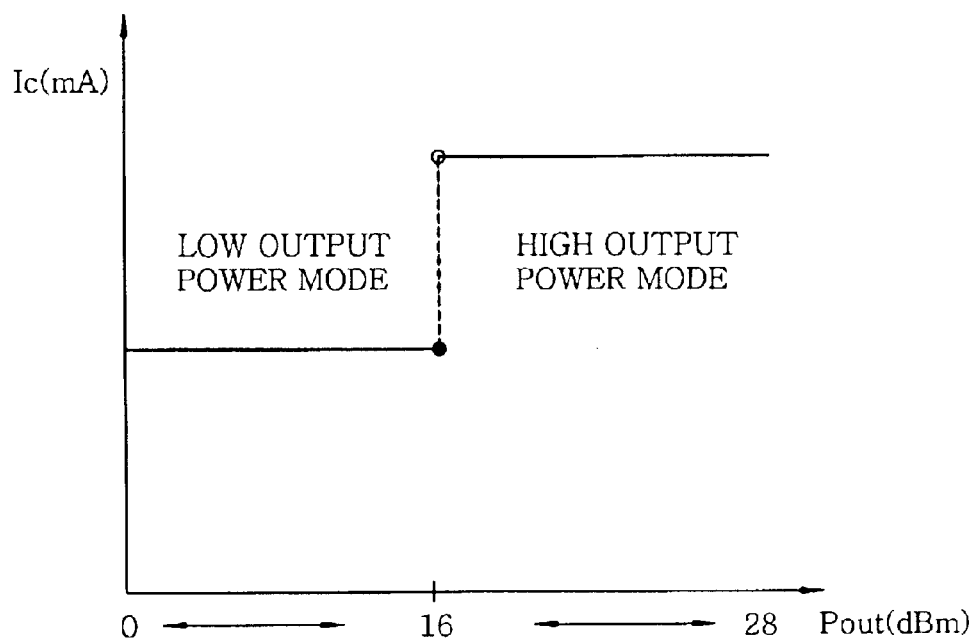
FIG. 3A illustrates a quiescent current $I_c$ of a power amplifier of the present invention as a function of an output power Pout.
Figure 3B:
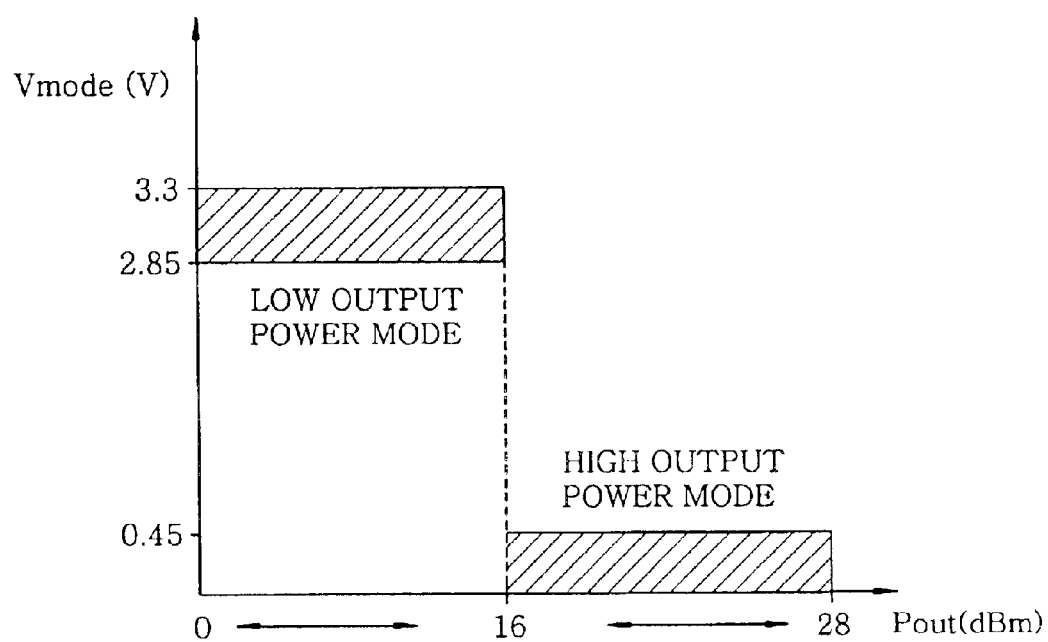
FIG. 3B shows control voltage Vmode as a function of an output power Pout.

The control voltage Vmode is supplied by a built-in mobile station modem (MSM) chip of a conventional CDMA mobile handset, so that no additional circuitry is required to supply the control voltage Vmode to the bias current control circuit 103. Referring to FIGS. 3A and 3B for example, Vmode is low (e.g., about 0 V to 0.45 V) when an output power Pout is above 16 dBm (high output power mode), and high (e.g., about 2.85 V to 3.3 V) when the output power Pout is not greater than 16 dBm (low output power mode).

When Pout is in the high output power mode, Vmode is logic low (about 0 V to 0.45 V) and thus the transistors Q4 and Q5 will be off. Therefore, the bias current control circuit 103 does not draw any current from the bias circuit 101, so that the power amplifier shown in FIG. 2A becomes equivalent to the conventional one shown in FIG. 1A (when Pout is high).

When Pout is in the low output power mode, Vmode is logic high (about 2.85 V to 3.3 V) and thus Q4 and Q5 will be switched on, drawing $I_{Q4}$ from the bias circuit 101, which in turn increases a current $I_{R1}$ passing through the resistor R1 to raise a voltage drop thereat. Thus, an electric potential of a base of Q2 declines. Accordingly, a current to the base of Q2 decreases, causing reduction of $I_B$ and $I_C$ (when Pout is low).

Figure 1B:
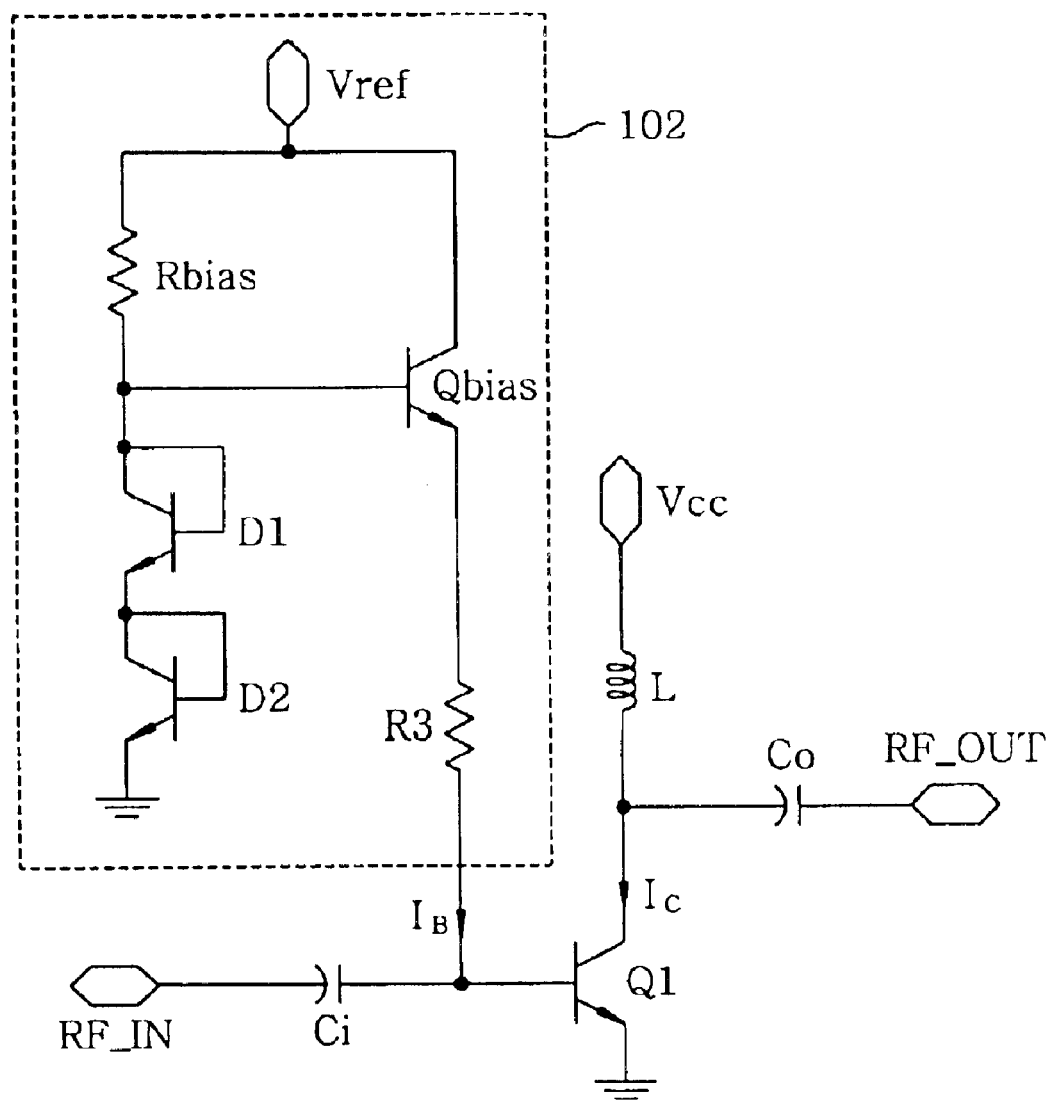
FIG. 1B represents another conventional power amplifier including a bias circuit 102 applying a bias current $I_B$ to an amplifying transistor Q1.
Figure 2B:
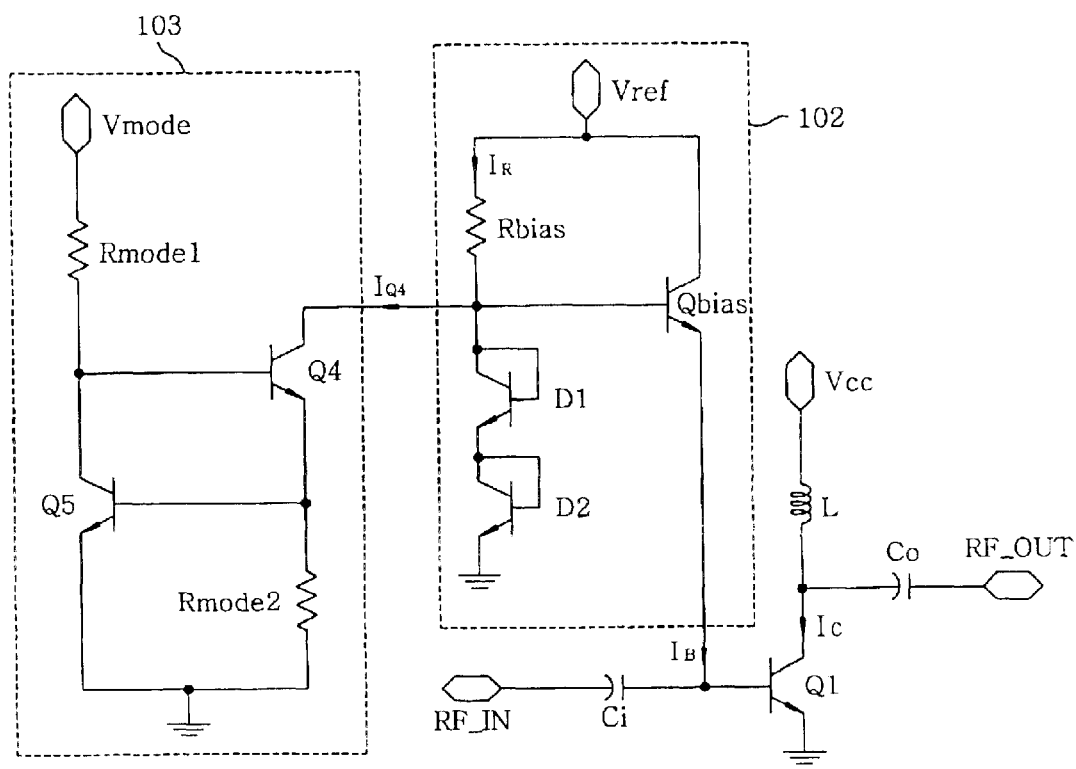

Referring to FIG. 2B, there is illustrated a power amplifier of the present invention, wherein the conventional power amplifier shown in FIG. 1B is provided with the bias current control circuit 103, which is identical to that of FIG. 2A, in accordance with the first embodiment of the present invention. As shown, the collector of Q4 of the bias current control circuit 103 is connected to a node between Rbias and D1. The power amplifier shown in FIG. 2B operates in the same way as that of FIG. 2A, as described below.

When Pout is high, Vmode applies a low voltage (about 0 V to 0.45 V) and the transistors Q4 and Q5 will be off. Therefore, the bias current control circuit 103 does not draw any current from a bias circuit 102, so that the power amplifier shown in FIG. 2B becomes equivalent to the conventional one shown in FIG. 1B (when Pout is high).

When Pout is low, Vmode asserts a high voltage (about 2.85 V to 3.3 V) and thus Q4 and Q5 will be switched on, drawing $I_{Q4}$ from the bias circuit 102, which in turn increases a current $I_R$ passing through the resistor Rbias to raise a voltage drop thereat. Thus, an electric potential of a base of Qbias declines. Accordingly, a current to the base of Qbias decreases, causing reduction of $I_B$ and $I_C$.

Figure 4A:
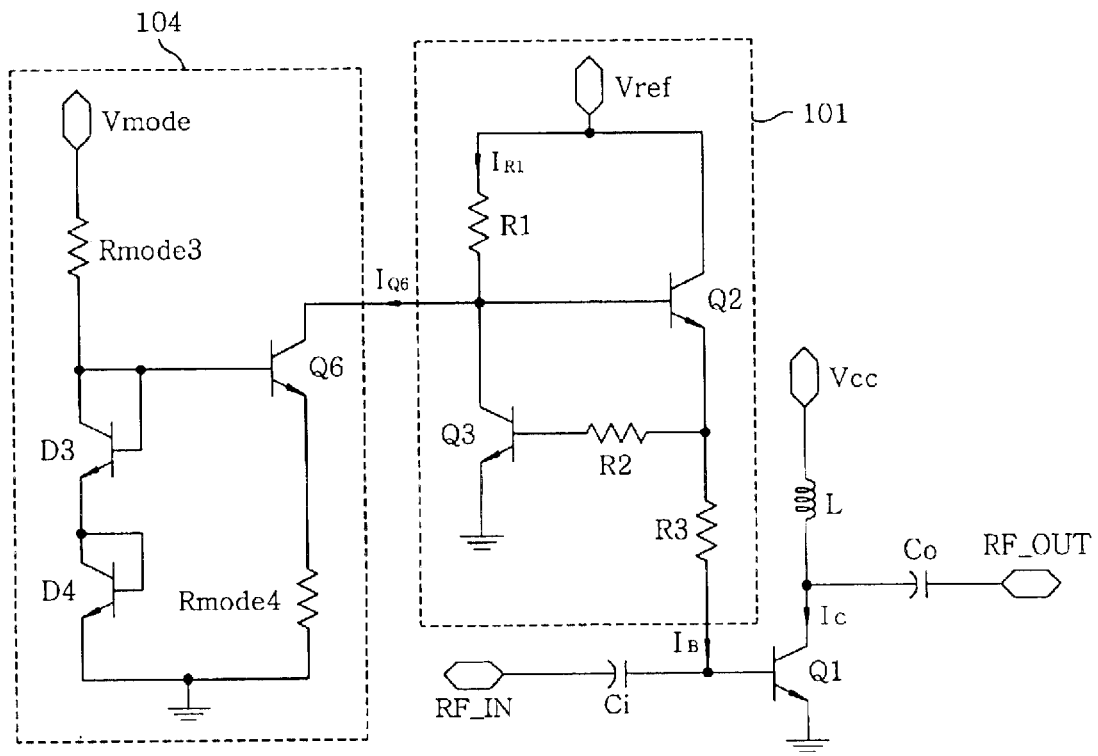
FIGS. 4A and 4B illustrate power amplifiers, each including a bias current control circuit 104 in accordance with a second embodiment of the present invention.

Referring to FIG. 4A, there is illustrated a power amplifier of the present invention, wherein the conventional power amplifier shown in FIG. 1A is provided with a bias current control circuit 104 in accordance with a second embodiment of the present invention.

The bias current control circuit 104 is of a current mirror configuration including a control transistor Q6, a collector thereof being coupled between R1 and Q3 of the bias circuit 101; an emitter-base diode D3, an anode thereof being coupled to a base of Q6; another emitter-base diode D4, an anode thereof being connected to a cathode of D3 and a cathode thereof being grounded; a resistor Rmode3, one end thereof being supplied with the control voltage Vmode and the other end thereof being coupled to the base of Q6 and an anode of D3; and another resistor Rmode4, one end thereof being connected to an emitter of Q6 and the other end thereof being grounded. The collector of Q6 connected to a node between R1 and the collector of Q3 serves as an additional current path for the bias circuit 101. For a given bias circuit 101, $I_{Q6}$, a bypass current from the bias circuit 101 to the bias current control circuit 104, is determined by Vmode, Rmode3 and Rmode4.

As in the power amplifier shown in FIG. 2A, when Pout is high and Vmode is low (about 0 V to 0.45 V), the transistor Q6 will be off. Therefore, the bias current control circuit 104 does not draw any current from the bias circuit 101, so that the power amplifier of FIG. 4A in its high output power mode becomes equivalent to the conventional one shown in FIG. 1A.

Similarly, in the low output power mode, Vmode is high (about 2.85 V to 3.3 V), so that Q6 will be switched on, drawing $I_{Q6}$ from the bias circuit 101, which in turn increases a current $I_{R1}$ passing through the resistor R1 to raise the voltage drop thereat. Thus, the electric potential of the base of Q2 declines. Accordingly, the current to the base of Q2 decreases, causing reduction of $I_B$ and $I_C$.

Figure 4B:
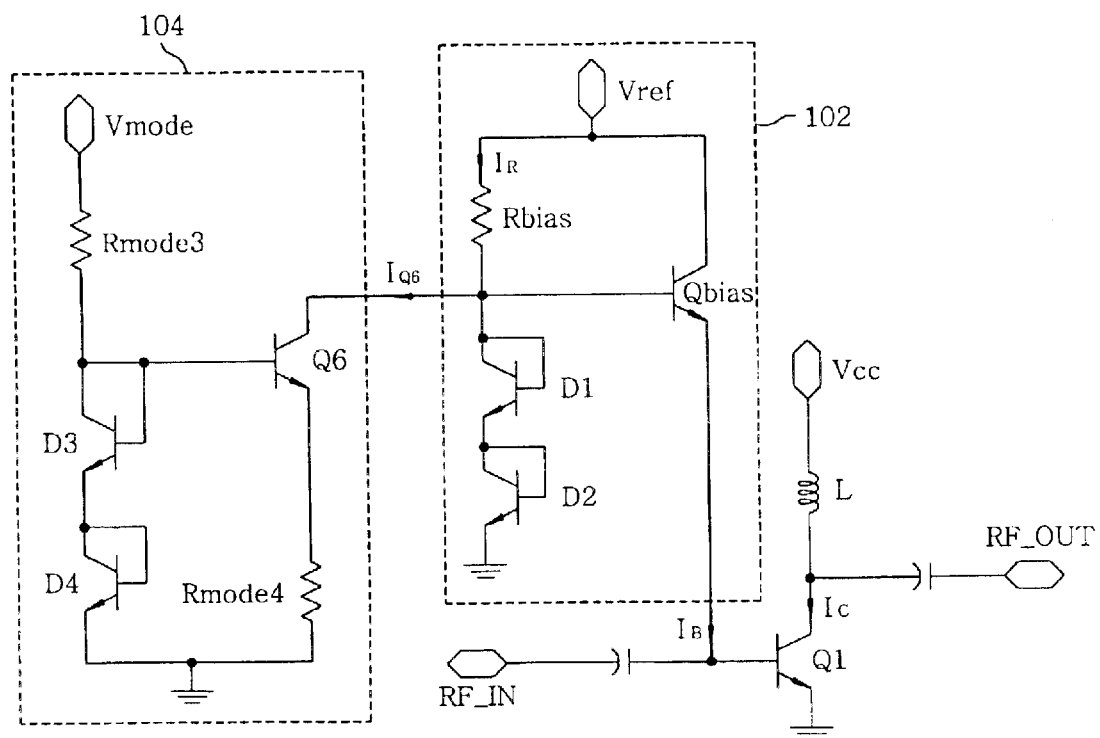

Referring to FIG. 4B, there is illustrated a power amplifier of the present invention, wherein the conventional power amplifier shown in FIG. 1B is provided with the bias current control circuit 104, which is identical to that of FIG. 4A, in accordance with the second embodiment of the present invention. In this configuration, the collector of Q6 is connected to a node between Rbias and D1. The power amplifier shown in FIG. 4B operates in the same way as that of FIG. 4A, as described below.

When Vmode is low (about 0 V to 0.45 V), the transistor Q6 will be off. Therefore, the bias current control circuit 104 does not draw any current from the bias circuit 102, so that the power amplifier of FIG. 4B becomes equivalent to the conventional one shown in FIG. 1B while the high output power mode persists.

When Vmode is high (about 2.85 V to 3.3 V), Q6 will be switched on, drawing $I_{Q6}$ from the bias circuit 102, which in turn increases a current $I_R$ passing through the resistor Rbias to raise the voltage drop thereat. Thus, the electric potential of the base of Qbias declines. Accordingly, the current to the base of Qbias decreases, causing reduction of $I_B$ and $I_C$, in case of the low output power mode.

As described above, the present invention provides a power amplifier including a bias current control circuit for reducing an operation current of the amplifying transistor so as to improve PAE when an output power level is low. The bias current control circuit of the invention is implemented by using two resistors and two or three transistors only. Therefore, the bias current control circuit of the present invention can be readily accommodated in a conventional MMIC chip incorporating therein the power amplifier circuitry, without significantly increasing a chip area and power consumption.

Figure 5:
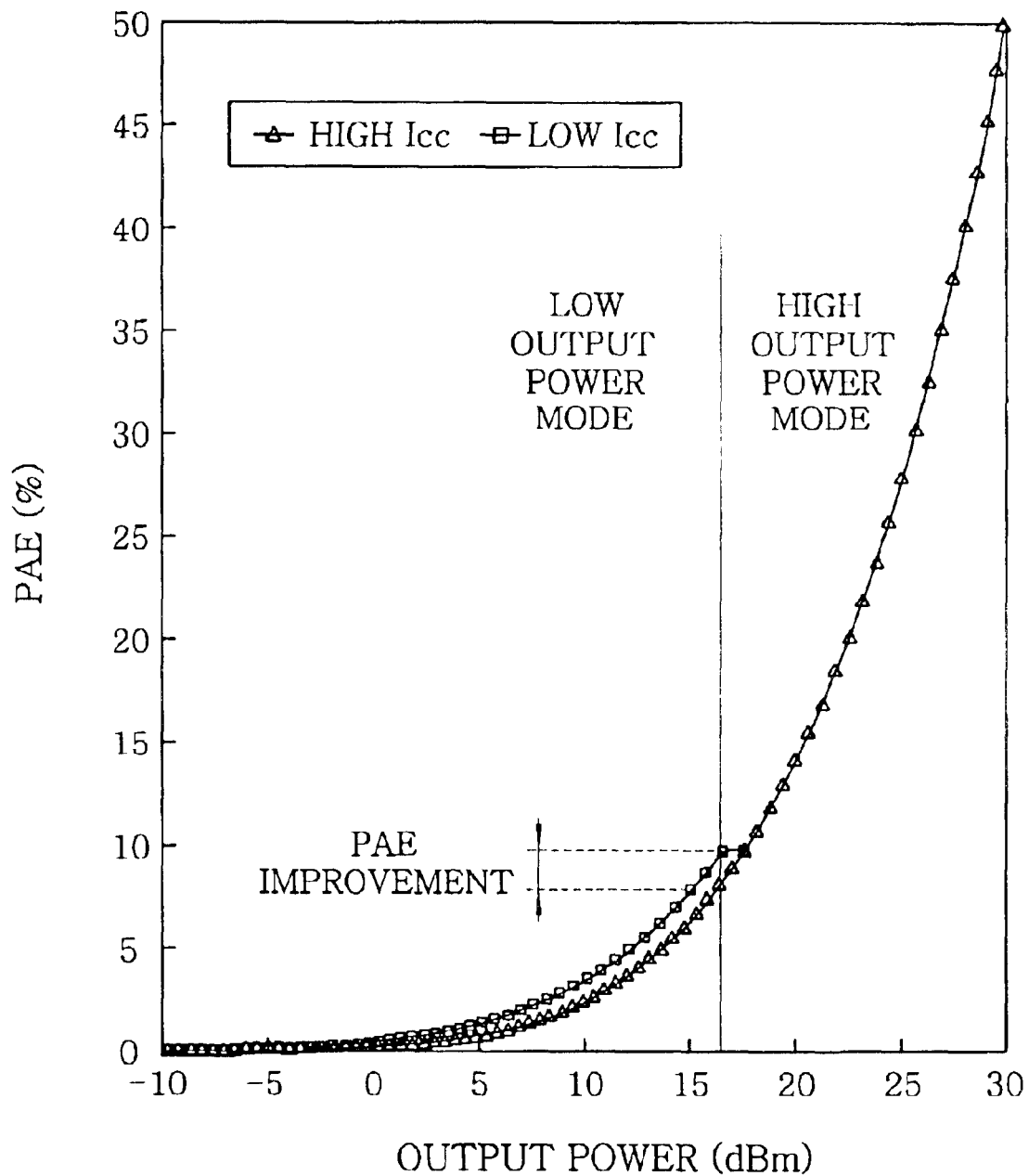
FIG. 5 exemplifies a graph illustrating PAE improvement in accordance with the present invention.

FIG. 5 shows the PAE of the MMIC power amplifier including the bias current control circuit of the present invention. This graph leads to the PAE improvement by a factor of 1.3 at an output power of 16 dBm.

The control voltage Vmode, supplied by the conventional MSM chip, does not maintain a constant value but varies within a 0.45 V range during the high (or low) power mode. It is desirable for an operation current of Q1 to be insensitive to such variation. It has been found in the power amplifiers of the present invention that the overall variation of the quiescent current $I_C$, being the operation current of Q1, remains as low as, e.g., 1.5 mA as Vmode fluctuates within a 0.45 V range.

It should be noted that the control voltage Vmode can be configured differently. For instance, depending on the mobile handset system configuration, Vmode can be logic low in case of the low output power mode and logic high in case of the high output power mode. The logic low and logic high voltage ranges can also differ from those of 0–0.45 V and 2.85–3.3 V exemplified in the preferred embodiments. Likely, the boundary between the low output power mode and the high output power mode does not need to be 16 dBm but can be different values and the maximum output power can be also other than 28 dBm.

It is to be readily appreciated by those skilled in the art that such variations can be easily accommodated by simple modifications of the preferred embodiments of the present invention, e.g., by employing an inverter at a Vmode terminal, p-type transistors at the bias current control circuit and so on.

While the invention has been shown and described with respect to the preferred embodiments, it will be understood by those skilled in the art that various changes and modifications may be made without departing from the spirit and the scope of the invention as defined in the following claims.

What is claimed is:

1. A power amplifier for use in a mobile handset, comprising:
    an amplifying transistor for generating an output of the mobile handset;
    a bias circuit including a bias transistor, the bias circuit providing a bias current to bias the amplifying transistor; and
    a bias current control circuit, respective to a control signal, for adjusting the bias current to control an operation current of the amplifying transistor,
    wherein the control signal is determined by a power level of the output of the mobile handset and the bias current control circuit includes means for drawing a bypass current from the bias circuit in response to the control signal in order to reduce the bias current.

2. The power amplifier of claim 1, wherein the bias current control circuit has a current mirror structure.

3. The power amplifier of claim 1, wherein the mobile handset operates in one of a high output power mode and a low output power mode, and the bias current is reduced when the mobile handset is in the low output power mode.

4. The power amplifier of claim 3, wherein the control signal is of a first and a second logic level when the mobile handset is in the high and the low output power mode, respectively.

5. The power amplifier of claim 4, wherein the means for drawing the bypass current has a control transistor, and the control transistor is turned off when the control signal is of the first logic level, and, if otherwise, the control transistor is turned on so that the bypass current passes through the control transistor.

6. The power amplifier of claim 3, wherein the control signal is logic high and logic low for the low and the high output power mode, respectively.

7. The power amplifier of claim 5, wherein the bias current control circuit further includes:
    an auxiliary transistor, an emitter thereof being grounded;
    a first resistor having a first end of the first resistor and a second end of the first resistor, the first end of the first resistor being supplied with the control signal and the second end of the first resistor being connected to a node between a base of the control transistor and a collector of the auxiliary transistor; and
    a second resistor having a first end of the second resistor and a second end of the second resistor, the first end of the second resistor being connected to a node between an emitter of the control transistor and a base of the auxiliary transistor and the second end of the second resistor being grounded.

8. The power amplifier of claim 5, wherein the bias current control circuit further includes:
    a first diode having a cathode of the first diode and an anode of the first diode, the first diode being made of a bipolar junction transistor of which collector and base are connected to each other;
    a second diode having a cathode of the second diode and an anode of the second diode, the second diode being made of a bipolar junction transistor of which collector and base are connected to each other, the cathode of the second diode being grounded, and the anode of the second diode being connected to the cathode of the first diode;
    a first resistor having a first end of the first resistor and a second end of the first resistor, the first end of the first resistor being supplied with the control signal and the second end of the first resistor being connected to a node between a base of the control transistor and the anode of the first diode; and
    a second resistor having a first end of the second resistor and a second end of the second resistor, the first end of the second resistor being connected to an emitter of the control transistor and the second end of the second resistor being grounded.

* * * * *